United States Patent
Lim et al.

(10) Patent No.: US 7,504,289 B2
(45) Date of Patent: Mar. 17, 2009

(54) PROCESS FOR FORMING AN ELECTRONIC DEVICE INCLUDING TRANSISTOR STRUCTURES WITH SIDEWALL SPACERS

(75) Inventors: Sangwoo Lim, Seoul (KR); Stanley L. Filipiak, Pflugerville, TX (US); Paul A. Grudowski, Austin, TX (US); Venkat R. Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 351 days.

(21) Appl. No.: 11/258,781

(22) Filed: Oct. 26, 2005

(65) Prior Publication Data

US 2007/0090455 A1   Apr. 26, 2007

(51) Int. Cl.
*H01L 21/8238* (2006.01)
(52) U.S. Cl. .................. 438/154; 438/231; 257/E21.63
(58) Field of Classification Search ......... 438/228–233, 438/154; 257/E21.63
See application file for complete search history.

(56) References Cited

U.S. PATENT DOCUMENTS

| | | | |
|---|---|---|---|
| 4,605,947 A | | 8/1986 | Price et al. |
| 5,200,351 A | * | 4/1993 | Hadjizadeh-Amini ....... 438/305 |
| 5,849,616 A | * | 12/1998 | Ogoh .......................... 438/231 |
| 5,960,270 A | | 9/1999 | Misra et al. |
| 5,970,330 A | * | 10/1999 | Buynoski ..................... 438/198 |
| 6,444,512 B1 | | 9/2002 | Madhukar et al. |
| 6,506,642 B1 | | 1/2003 | Luning et al. |
| 6,620,713 B2 | | 9/2003 | Arghavani et al. |
| 6,750,519 B2 | | 6/2004 | Lin et al. |
| 6,770,521 B2 | | 8/2004 | Visokay et al. |
| 6,864,135 B2 | | 3/2005 | Grudowski et al. |
| 6,891,233 B2 | | 5/2005 | Lin et al. |
| 6,897,095 B1 | | 5/2005 | Adetutu et al. |
| 6,933,565 B2 | | 8/2005 | Matsumoto et al. |
| 6,936,508 B2 | | 8/2005 | Visokay et al. |
| 6,982,465 B2 | | 1/2006 | Kumagai et al. |
| 7,033,888 B2 | | 4/2006 | Pan et al. |
| 7,105,394 B2 | | 9/2006 | Hachimine et al. |
| 7,122,414 B2 | | 10/2006 | Huotari |
| 7,297,588 B2 | | 11/2007 | Adetutu et al. |

(Continued)

FOREIGN PATENT DOCUMENTS

WO    2004049406 A1    6/2004

OTHER PUBLICATIONS

U.S. Appl. No. 11/148,455, filed Jun. 9, 2005.

(Continued)

*Primary Examiner*—Richard A. Booth (57) ABSTRACT

An electronic device can include a first transistor structure including a first gate electrode surrounded by a first sidewall spacer having a first stress and a second transistor structure including a second gate electrode surrounding a second sidewall spacer having second stress. The first sidewall spacer is an only sidewall spacer surrounding the first gate electrode or a closer sidewall spacer as compared to any other sidewall spacer that surrounds the first gate electrode and the second sidewall spacer is an only sidewall spacer surrounding the second gate electrode or a closer sidewall spacer as compared to any other sidewall spacer that surrounds the second gate electrode, wherein the first stress has a lower value as compared to the second stress. More than one process can be used to form the electronic device.

7 Claims, 5 Drawing Sheets

U.S. PATENT DOCUMENTS

| | | | |
|---|---|---|---|
| 7,316,960 | B2* | 1/2008 | Ting .................... 438/301 |
| 7,332,433 | B2 | 2/2008 | Choi et al. |
| 7,374,987 | B2 | 5/2008 | Chidambarrao et al. |
| 2004/0014306 | A1 | 1/2004 | Komatsu |
| 2004/0262784 | A1 | 12/2004 | Doris et al. |
| 2005/0020022 | A1 | 1/2005 | Grudowski |
| 2005/0040461 | A1 | 2/2005 | Ono et al. |
| 2006/0249794 | A1 | 11/2006 | Teh et al. |
| 2007/0051312 | A1 | 3/2007 | Sneh |
| 2007/0069311 | A1 | 3/2007 | Adetutu et al. |

OTHER PUBLICATIONS

Choi, C., et al. "Aggressively Scaled Ultra Thin Undoped HfO2 Gate Dielectric (EOT <0.7 nm) With TaN Gate Electrode Using Engineered Interface Layer," IEEE Electron Device Letters, v. 26, No. 7, Jul. 2005, pp. 454-457.

Misra, V., et al. "Electrical Properties of Ru-Based Alloy Gate Electrodes for Dual Metal Gate Si-CMOS," IEEE Electron Device Letters, v. 23, No. 6, Jun. 2002, pp. 354-356.

Senzaki, Y., et al. "Atomic Layer Deposition of High-k Dielectric and Metal Gate Stacks for MOS Devices," International Conference on Characterization and Metrology for ULSI Tehcnology, Mar. 15-18, 2005, SEMATECH Presentation, 35 pages.

Silicon Nano Device Laboratory, Department of Electrical & Computer Engineering, National Uiversity of Singapore, May 2004 Presentation, 60 pages.

Ha, et al., "Molybdenum Gate Work Function Engineering for Ultra-Thin-Body Silicon-on-Insulator (UTB SOI) MOSFETs," Jpn. J. Appl. Phys., Apr. 2003, pp. 1979-1982, vol. 42, Part 1, No. 4B.

Polishchuk, et al., "Dual Work Function Metal Gate CMOS Transistors by Ni-Ti Interdiffusion," IEEE Electron Device Letters, Apr. 2002, pp. 201-202, vol. 23, No. 4.

Ranade, et al., "Work Function Engineering of Molybdenum Gate Electrodes by Nitrogen Implantation," Electrochemical and Sold-State Letters, The Electrochemicla Society, Inc., 2001, pp. G85-G87, University of California at Berkeley, California.

Pidin et al. "A Novel Strain Enhanced CMOS Architecture using Selectively Deposited High Tensile and High Compressive Silicon Nitride Films," IEDM 2004, pp. 1-4.

Yang et al. "Dual Stress Liner for High Performance sub-45nm Gate Length SOI CMOS Manufacturing," IEDM 2004, pp. 1-4.

U.S. Appl. No. 11/928,314, filed on Oct. 30, 2007.

Actions on the Merits by U.S.P.T.O, as of Jul. 11, 2008, 5 pgs.

Notice of Allowance for U.S. Appl. No. 11/148,455.

* cited by examiner

PROCESS FOR FORMING AN ELECTRONIC DEVICE INCLUDING TRANSISTOR STRUCTURES WITH SIDEWALL SPACERS

BACKGROUND

1. Field of the Disclosure

The present invention relates to electronic devices and processes for forming electronic devices, and more particularly, to electronic devices including transistor structures with sidewall spacers and processes for forming the electronic devices.

2. Description of the Related Art

Semiconductor-on-insulator ("SOI") architectures are becoming the more common as electronic and device performance requirements continue to be more demanding. P-channel and n-channel transistors formed using an SOI substrate typically include active regions that have channel lengths and channel widths along <110> crystal directions. Carrier mobility within the channel regions of the p-channel and n-channel transistors is an area for continued improvement.

Many approaches use different widths of sidewall spacers to affect the performance of the transistors. For example, relatively narrower sidewall spacers can be formed adjacent to gate electrodes of n-channel transistors, and relatively wider sidewall spacers can be formed adjacent to gate electrodes of p-channel transistors. The different widths of sidewall spacers can involve additional or more complex processing operations and result in transistors, particularly p-channel transistors that may need to be designed wider to account for the wider sidewall spacers. Lower component density and decreased yield may occur with the sidewall spacers of differing widths.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a first transistor structure including a first gate electrode surrounded by a first sidewall spacer having a first stress and a second transistor structure including a second gate electrode surrounding a second sidewall spacer having second stress. The first sidewall spacer is an only sidewall spacer surrounding the first gate electrode or a closer sidewall spacer as compared to any other sidewall spacer that surrounds the first gate electrode and the second sidewall spacer is an only sidewall spacer surrounding the second gate electrode or a closer sidewall spacer as compared to any other sidewall spacer that surrounds the second gate electrode, wherein the first stress has a lower value as compared to the second stress. In a particular embodiment, the first transistor structure can be a p-channel transistor structure, and the second transistor structure can be an n-channel transistor structure. More than one process can be used to form the electronic device.

Before addressing details of embodiments described below, some terms are defined or clarified. The term "active region" is intended to mean part of a transistor structure through which carriers are designed to flow. The active region includes a channel region, a source region, a drain region, a source/drain region, or any combination thereof for one or more transistor structures.

The term "primary surface" is intended to mean a surface from which a transistor structure is subsequently formed. The primary surface may be an original surface of a base material before forming any electronic components or may be a surface of a semiconductor layer that overlies the base material. For example, an exposed surface of a semiconductor layer of a semiconductor-on-insulator substrate can be a primary surface, and not the original surface of the base material.

The term "sidewall spacer" is intended to mean a structure that has a principal purpose of substantially blocking an implant near an edge of a feature, such that, from a top view, an implanted region, formed after the spacer has been formed, is offset from the edge. The feature may be within or over a substrate, and the edge may be substantially vertical or sloped.

The term "stress" is intended to mean the composite force resulting from two dissimilar materials contacting each other. Stress can be compressive, zero, or tensile. As used in this specification, compressive stress has a negative value, and tensile stress has a positive value. When comparing values of stresses, actual values, and not absolute values, are used. For example, a first layer having a stress of −2.1 GPa has a lower value as compared to a second layer having a stress of −1.6 GPa, even though the first layer is more compressive as compared to the second layer. Unless stated expressly to the contrary, stress of a layer is measured after depositing the layer and before the layer is exposed to any subsequent thermal cycle.

The term "transistor structure" is intended to mean a gate electrode and associated channel region, source and drain regions or source/drain regions. A gate dielectric layer may or may not be part of the transistor structure. A transistor structure can be configured to function as a transistor, a capacitor, or a resistor.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 1:
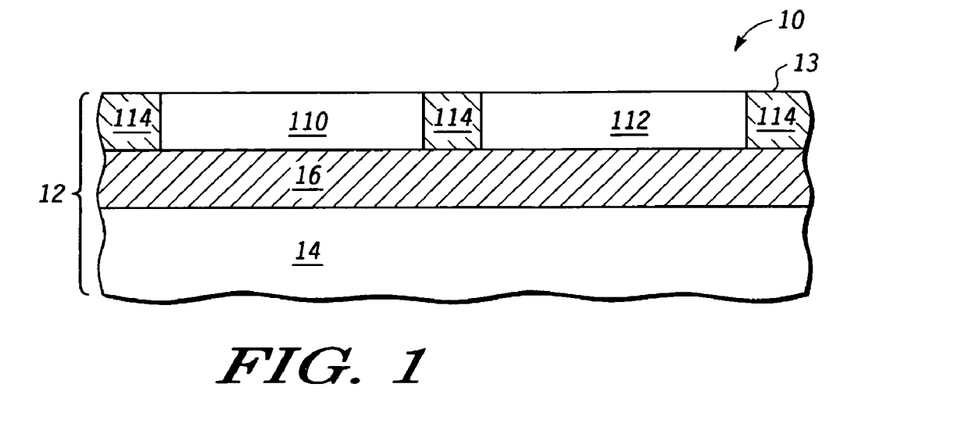
FIG. 1 includes an illustration of a cross-sectional view of a portion of a workpiece including an n-channel active and a p-channel active region.

FIG. 1 includes an illustration of a cross-sectional view of a portion of a substrate 12 of a partially formed electronic device 10, such as an integrated circuit. Substrate 12 can include a monocrystalline semiconductor wafer, a semiconductor-on-insulator wafer, a flat panel display (e.g., a silicon layer over a glass plate), or other substrate conventionally used to form electronic devices. The upper surface of substrate 12 is primary surface 13. In one embodiment, substrate 12 includes a base material 14, an insulating layer 16 and a semiconductor layer substantially having a (100) surface crystal orientation and channel lengths and channel widths along <110> crystal directions. Field isolation regions 114 can be formed leaving remaining portions of the semiconductor layer as active regions 110 and 112. In a particular embodiment, active region 110 can be an n-channel active region and active region 112 can be a p-channel active region, and each of the active layers has a primary surface that is exposed that lies substantially along a (100) crystal plane.

Figure 2:
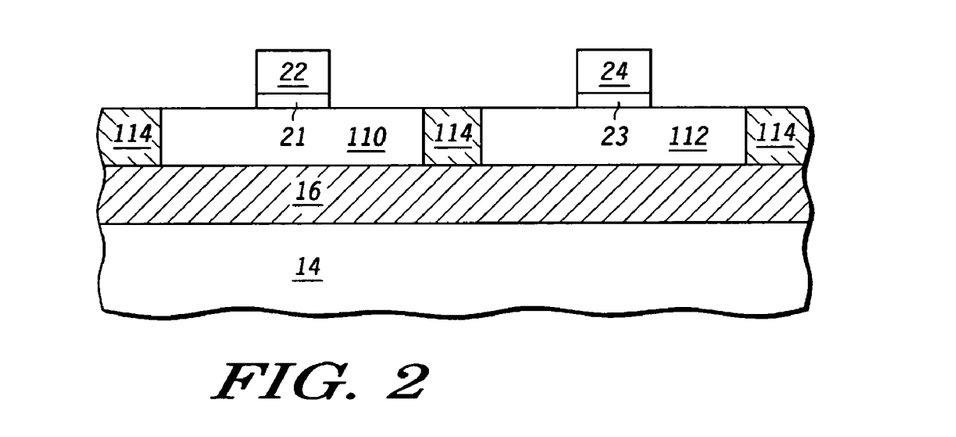
FIG. 2 includes an illustration of a cross-sectional view of the workpiece of FIG. 1 after formation of gate electrodes.

Gate dielectric layers 21 and 23 and gate electrodes 22 and 24 are formed over the substrate 12 as illustrated in FIG. 2. Gate dielectric layer 21 can include a film of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Gate dielectric layer 21 can have a thickness in a range of approximately 1 to approximately 25 nm. Gate dielectric layer 21 may be thermally grown using an oxidizing or nitridizing ambient, or deposited using a conventional or proprietary chemical vapor deposition ("CVD") technique, physical vapor deposition ("PVD") technique, or a combination thereof. As compared to gate dielectric layer 21, gate dielectric layer 23 can have the same or different materials, be formed at the same or different time, have the same or a different thickness, or any combination thereof.

In one embodiment, gate electrode 22 can include a surface portion that substantially sets the work function for the transistor in the completed electronic device. In a more particular embodiment, the surface portion can include a metallic element, such as a transition metal element. In another embodiment, the surface portion may include a second element that is silicon, oxygen, nitrogen or any combination thereof. The surface portion of gate electrode 22 can include $Ti_aN_b$, $Mo_aN_b$, $Mo_aSi_bN_c$, $Ru_aO_b$, $Ir_aO_b$, Ru, Ir, $Mo_aSi_bO_c$, $Mo_aSi_bO_cN_d$, $Mo_aHf_bO_c$, $Mo_aHf_bO_cN_d$, other transition metal containing material, or any combination thereof.

Another portion of gate electrode 22 may overlie the surface portion. In one embodiment, the overlying portion is relatively more conductive as compared to the surface portion and can include a material such as amorphous silicon, polysilicon, a nitride, a metal-containing material, another suitable material, or any combination thereof. In one embodiment, the material can include platinum, palladium, iridium, osmium, ruthenium, rhenium, indium-tin, indium-zinc, aluminum-tin, or any combination thereof. In another embodiment, a material capable of reacting with silicon to form a silicide, and can include Ti, Ta, Co, W, Mo, Zr, Pt, other suitable material, or any combination thereof is formed on gate electrode 22 and later reacted to form a metal silicide. In another embodiment, gate electrode 22 can include the relatively more conductive portion and may not include the surface portion. Gate electrode 22 can have a thickness of between approximately 30 and approximately 500 nm.

Gate electrode 24 can be formed using any combination of materials or techniques previously described for formation of gate electrode 22. The materials, thicknesses techniques for forming portions of gate electrode 24, time of formation, or any combination thereof could be the same or different from those used to form portions of gate electrode 22. In one embodiment, the surface portion of gate electrode 24 is different from the surface portion of gate electrode 22. In a more particular embodiment, the surface portion for gate electrode 24 can include $Ta_aC_b$, $Ta_aSi_bN_c$, $Ta_aN_b$, $Ta_aSi_bC_c$, $Hf_aC_b$, $Nb_aC_b$, $Ti_aC_b$, $Ni_aSi_b$, or any combination thereof. Gate electrode 24 also includes a more conductive portion substantially similar to gate electrode 22. The surface portion of gate electrode 24 is not required.

Figure 3:
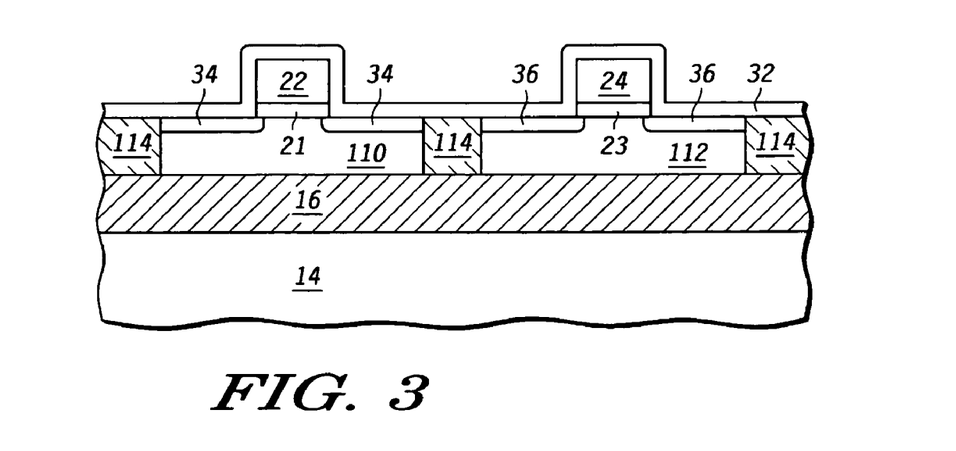
FIG. 3 includes an illustration of a cross-sectional view of a workpiece of FIG. 2 after formation of doped regions.

Liner layer 32 is formed over the substrate, as illustrated in FIG. 3, using conventional or proprietary process. In one embodiment, liner layer 32 can include an oxide, a nitride, an oxynitride, or a combination thereof. In another embodiment, liner layer 32 has a thickness not greater than approximately 30 nm, in a particular embodiment, is not greater than approximately 20 nm in thickness, and in a more particular embodiment, is in a range of approximately 2 nm to approximately 15 nm. In still another embodiment, liner layer 32 can be grown or deposited by a technique previously described for the gate dielectric layer 21. Liner layer 32 can protect the sidewalls of gate electrodes 22 and 24 by covering them during subsequent processing and can reduce the likelihood of implant channeling within the substrate when dopant species are implanted through liner layer 32. Thus, liner layer 32 does not have a principal purpose of blocking implants. Liner layer 32 can serve as an etch stop layer during subsequent processing and can help reduce surface defects on exposed portions of partially formed electronic device 10.

A dopant can be introduced to form doped regions 34 and 36 within active regions 110 and 112, respectively. In one embodiment, an n-type dopant, (e.g. arsenic, phosphorus, antimony, or any combination thereof) is introduced into active region 110 adjacent to gate electrode 22 to form doped regions 34. In a specific embodiment, the dopant can be introduced using ion implantation and activated during one or more subsequent thermal cycles. In another embodiment, the doping concentration of doped regions 34 is at least approximately 1E17 atoms/cm$^3$. In a further embodiment, p-type dopant, (e.g. boron) is introduced into active region 112 adjacent to gate electrode 24 to form doped regions 36. The dopant may be introduced and activated as previously described for doped regions 34. In one embodiment, the doping concentration of doped regions 36 is at least approximately 1E17 atoms/cm$^3$.

Figure 4:
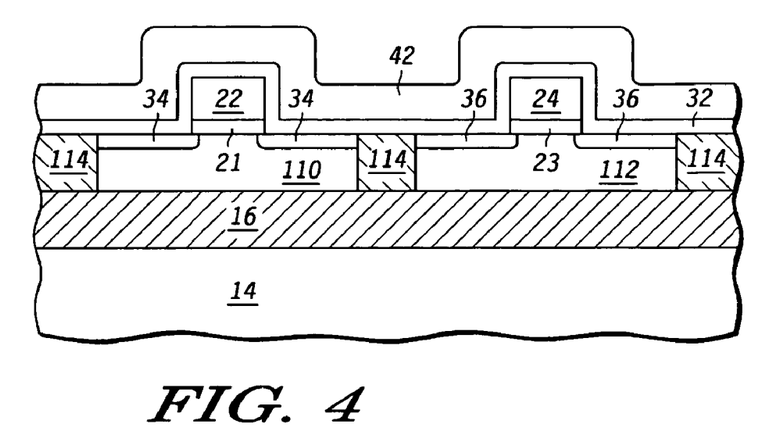
FIG. 4 includes an illustration of a cross-sectional view of the workpiece of FIG. 3 after formation of a sidewall spacer layer.

Layer 42 is formed over liner layer 32 as illustrated in FIG. 4 using a conventional or proprietary process. In one embodiment, layer 42 can include silicon, polysilicon, an oxide, a nitride, an oxynitride, or a combination thereof. In another embodiment, layer 42 can be grown or deposited by a technique previously described for the gate dielectric portion of gate electrode 22. In still another embodiment, layer 42 has a thickness not greater than approximately 200 nm, in a particular embodiment, not greater than approximately 100 nm, and in a more particular embodiment, layer 42 is in a range of approximately 5 nm to 90 nm.

In one embodiment, layer 42 is formed using a deposition process. Such deposition techniques can include PVD, CVD, or any combination thereof. In one particular embodiment, using a plasma-enhanced CVD process, silicon nitride film can be formed with either tensile or compressive stress by varying a process parameter such as: pressure, temperature, gas ratio, power density, frequency, or any combination thereof. One skilled in the art can appreciate that at least some of these factors can interact with each other, the physical arrangement of the reactor vessel, and one or more exposed surfaces of the workpiece. In one embodiment, the reactor vessel is a portion of a substrate-processing tool with a dual frequency radio frequency ("RF") generator and a height-adjustable chuck designed for processing substrates with a nominal diameter of 200 mm. In a specific embodiment, the process can be performed in a PRODUCER™ or CENTURA™ chamber made by Applied Materials, Inc. of Santa Clara, Calif. In one embodiment, the pressure can be in a range of approximately 1 to approximately 10 torr, and in a particular embodiment, in a range of approximately 2 to approximately 6.5 torr. In another embodiment, the chuck temperature can be in a range of approximately 200° C. to approximately 600° C., and in a particular embodiment, in a range of approximately 350° C. to approximately 600° C.

Other considerations unrelated to stress may limit the temperature. For example, the partially formed electronic device 10 may only tolerate temperatures up to 450° C.

In another embodiment, when a nitrogen-containing precursor and a silicon-containing precursor are used to form a silicon nitride film, the flow of nitrogen containing precursor can be approximately between 1.5 and 5 times greater than the silicon-containing precursor. In a more particular embodiment, ammonia can be the nitrogen-containing precursor, and silane can be the silicon-containing precursor. In an even more particular embodiment, the carrier gas stream can include a relatively inert gas, such as nitrogen, helium, argon, or a combination thereof. In one embodiment, the total RF power density can be in a range of approximately 0.050 to approximately 1.6 watts per square centimeter ("W/cm$^2$") while the substrate spacing can be in a range of approximately 0.51 to approximately 1.52 cm. In a more specific embodiment, for compressive silicon nitride film, the total RF power density can be in a range of approximately 0.050 to approximately 0.80 W/cm$^2$ while the substrate spacing is in a range of approximately 0.050 and approximately 1.1 cm. In another more specific embodiment, for a tensile silicon nitride film, the total RF power density can be in a range of approximately 0.050 to approximately 0.32 W/cm$^2$ while the spacing can be in a range of approximately 1.0 and approximately 1.3 cm. The RF power can be at one or more frequencies, and therefore, total RF power density is the sum of the RF power at each frequency divided by the area of the primary surface 13.

In one embodiment, layer 42 can have compressive stress. In a particular embodiment, the compressive stress can have a magnitude not less than approximately 1.5 GPa (i.e., stress$\leq$−1.5 GPa), in a particular embodiment, not less than approximately 2.1 GPa (i.e., stress$\leq$−2.1 GPa), and in a more particular embodiment, not less than 2.5 GPa (i.e., stress$\leq$−2.3 GPa). In another embodiment, layer 42 can be chosen to have a more compressive stress than a subsequent layer used to form a sidewall spacer adjacent to a gate electrode. In still another embodiment, layer 42 can be chosen to have a less tensile stress than a subsequent layer used to form a sidewall spacer adjacent to a gate electrode.

Figure 5:
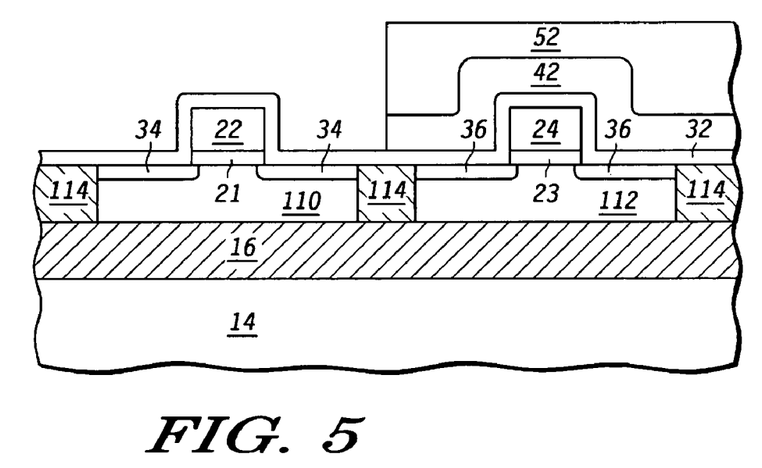
FIG. 5 includes an illustration of a cross-sectional view of the workpiece of FIG. 4 after removal of the sidewall spacer layer from over the n-channel active region.

A patterned masking layer 52 is formed over active region 112 using a conventional or proprietary lithographic technique. In one particular embodiment, the n-channel source drain implant mask is used to form the pattern. In another embodiment, a custom mask is used. An exposed portion of layer 42 is removed from active region 110 as illustrated in FIG. 5. In a particular embodiment, liner layer 32 can act as an etch stop. The patterned masking layer 52 can then be removed.

Figure 6:
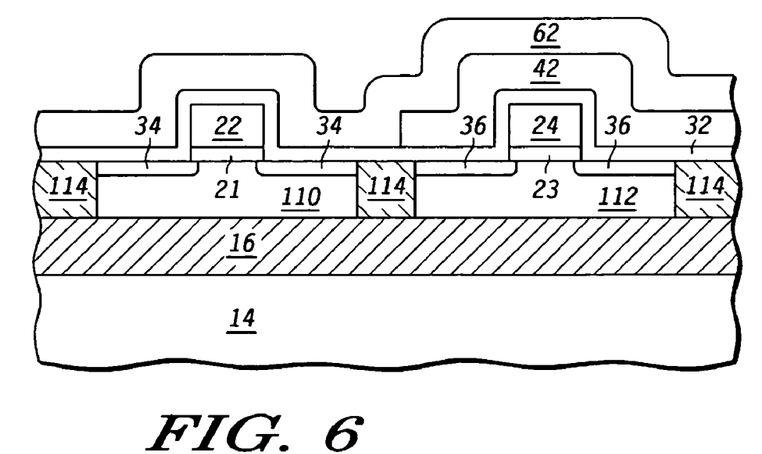
FIG. 6 includes an illustration of a cross-sectional view of the workpiece of FIG. 5 after formation of another sidewall spacer layer.

Layer 62 can be formed over the workpiece as illustrated in FIG. 6 using a conventional or proprietary process. Layer 62 can be formed using materials or techniques described previously for forming layer 42. Layer 62 can have the same thickness or different thickness as layer 42. In one embodiment, the stress of layer 62 can be tensile. In a particular embodiment, the tensile stress can have a magnitude not less than approximately 0.6 GPa (i.e., stress$\geq$+0.6 GPa), in another embodiment, not less than approximately 1.0 GPa (i.e., stress$\geq$+1.0 GPa), and in a more particular embodiment, not less than approximately 1.5 GPa (i.e., stress$\geq$+1.5 GPa).

Figure 7:
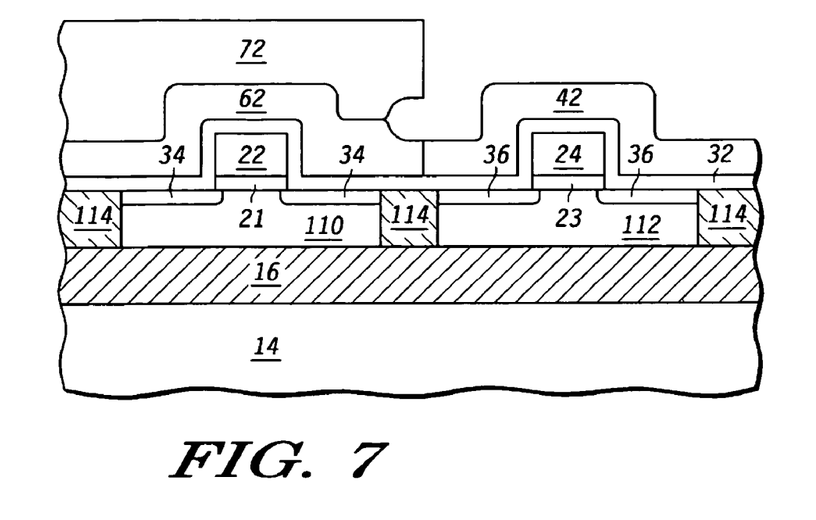
FIG. 7 includes an illustration of a cross-sectional view of the workpiece in FIG. 6 after removal of another sidewall spacer layer from over the p-channel active region.

A patterned masking layer 72 is formed over active region 110 using a conventional or proprietary lithographic technique. In one particular embodiment, the p-channel source drain implant mask can be used to form the pattern. In another embodiment, a custom mask is used. An exposed portion of layer 62 is removed to expose a portion of layer 42 as illustrated in FIG. 7. In one embodiment, a wet etch process is used. Tensile stress can increase the wet etch rate of films of similar compositions. A film with a higher value of stress (i.e., more tensile) can have a higher chemical etch rate than a film of substantially the same composition with a lower value of stress (i.e., more compressive). For example, layer 62 can be tensile and layer 42 can be compressive, layer 62 can be more tensile and layer 42 can be less tensile, or layer 62 can be less compressive and layer 42 can be more compressive.

In one non-limiting embodiment, when layer 62 includes tensile silicon nitride and layer 42 includes compressive silicon nitride. An HF solution can be used as a wet chemical etchant and have a concentration in a range of approximately 10:1 (10 parts water to 1 part HF) to approximately 1000:1, and in a particular embodiment can be in a range of approximately 50:1 to approximately 200:1. In a particular embodiment, layer 62 etches at a rate at least approximately six times higher than layer 42, and in a particular embodiment, etches at a rate in a range of approximately 10 to 15 times higher. Thus, wet chemical etching can be used to selectively remove portions of the layer 62 that overlie the remaining portions of layer 42 without removing too much of layer 42. The patterned masking layer 72 is then removed.

Figure 8:
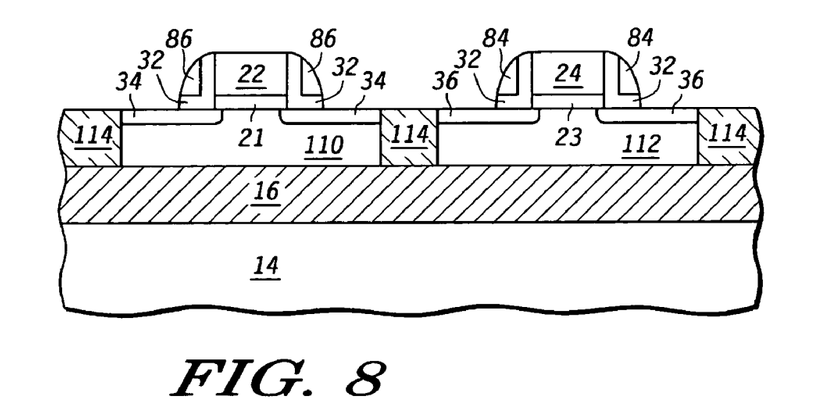
FIG. 8 includes an illustration of a cross-sectional view of the workpiece of FIG. 7 after formation of sidewall spacers.

The remaining portion of layer 42 overlies active region 112, and the remaining portion of layer 62 overlies active region 110. In a particular embodiment, remaining portions of layer 42 can be compressive and remaining portions of layer 62 can be tensile. Portions of the composite layer are removed using a conventional or proprietary process to form sidewall spacers 84 and 86 adjacent to gate electrode structures 22 and 24, respectively. In one embodiment, in a cross-sectional view, each of sidewall spacers 84 and 86 can have a shape that is substantially a half parabola, substantially rectangular, substantially triangular, substantially L-shaped, or the mirror image of said shape. Sidewall spacer 84 substantially resides within a remaining portion of liner layer 32 such that at least a portion of liner layer 32 lies between sidewall spacer 84 and gate electrode 24 and another at least a portion of liner layer 32 lies between sidewall spacer 84 active region 112. Sidewall spacer 86 substantially resides within a remaining portion of liner layer 32 such that at least a portion of liner layer 32 lies between sidewall spacer 86 and gate electrode 22 and another at least a portion of liner layer 32 lies between sidewall spacer 86 active region 110. In one embodiment, in a cross-sectional view, remaining portions of liner layer 32 are substantially L-shaped or the mirror image of L-shaped.

Another dopant (not illustrated) can be introduced into doped regions 34 and 36 within active regions 110 and 112, respectively, to complete formation of source/drain regions for the transistors structures. Sidewall spacer structures 84 and 86 can serve to substantially shield underlying portions of substrate 12 from direct doping via ion implantation. In one embodiment, an n-type dopant, (e.g. arsenic, phosphorus, antimony, or any combination thereof) is introduced into active region 110 adjacent to sidewall spacer 86. In a specific embodiment, the dopant can be introduced using ion implantation and activated during one or more subsequent thermal cycles. In another embodiment, the doping concentration is at least approximately 1E19 atoms/cm$^3$. A p-type dopant (e.g. boron) is introduced into active region 112 adjacent to sidewall spacer 84. The dopant may be introduced and activated as previously described for doped regions 34. In one embodiment, the doping concentration of doped regions 36 is at least approximately 1E19 atoms/cm$^3$. Optionally, the exposed portions of liner layer 32 can be removed, as illustrated in FIG. 8, using a conventional or proprietary technique. In one embodiment, transistor structures of electronic device 10 are substantially complete.

Figure 9:
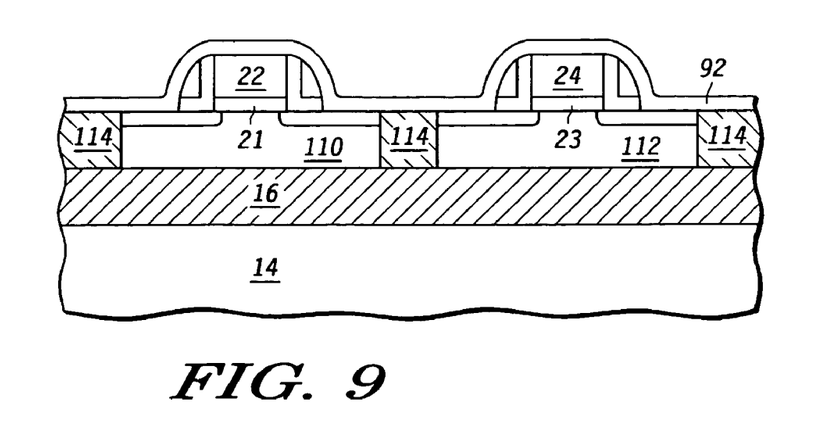
FIG. 9 includes an illustration of a cross-sectional view of the workpiece of FIG. 8 after formation of an etch-stop layer.
Figure 10:
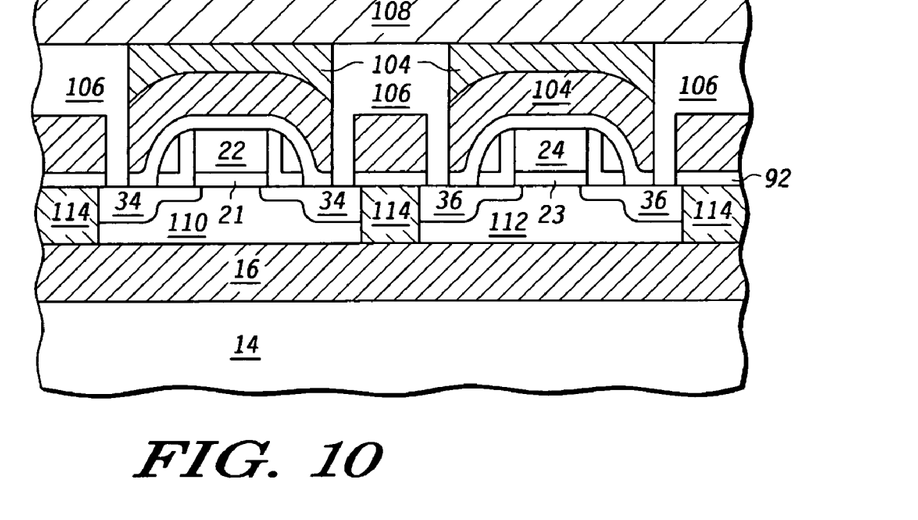
FIG. 10 includes an illustration of a cross-sectional view of the workpiece of FIG. 9 after substantial completion of the electronic device.

Processing can be continued to form a substantially completed electronic device. An etch stop layer 92 can now be formed as illustrated in FIG. 9 by conventional or proprietary processing. Etch stop layer 92 has a composition chosen to be dissimilar than a subsequently formed premetal dielectric (PMD) layer. In one embodiment, etch stop layer 92 can be formed using materials or techniques previously described for liner layer 32. Etch stop layer 92 may have a thickness no greater than approximately 100 nm. In a particular embodiment, the etch stop layer 92 comprises silicon nitride and has a relatively low magnitude of stress, as compared to layer 42, 62, or both. One or more insulating layers 104, one or more conductive layers 106, and one or more encapsulating layers 108 are formed using one or more conventional or proprietary techniques as illustrated in FIG. 10.

Figure 11:
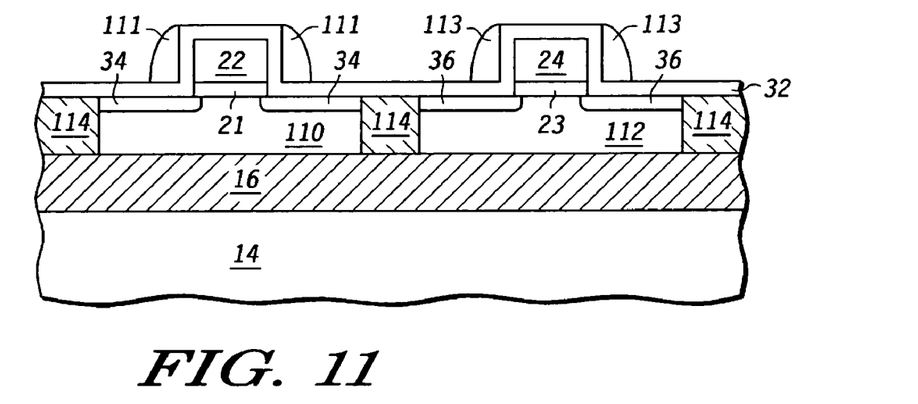
FIG. 11 includes an illustration of a cross-sectional view of the workpiece of FIG. 4 after formation of sidewall spacers.
Figure 12:
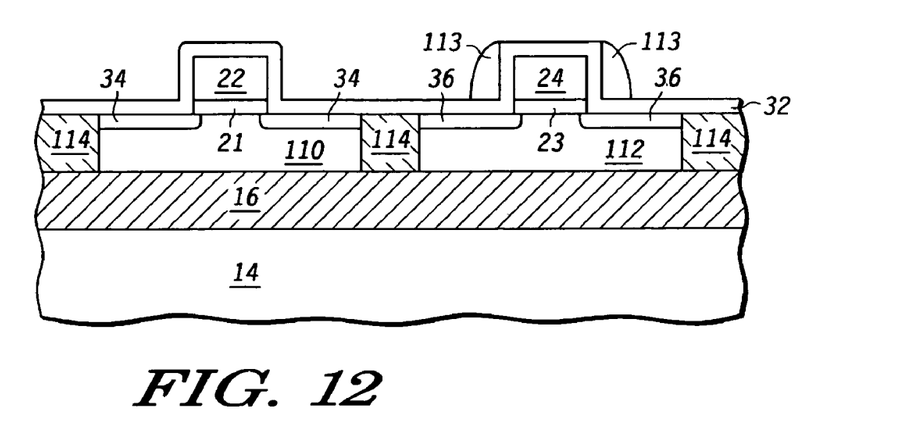
FIG. 12 includes an illustration of a cross-sectional view of the workpiece of FIG. 11 after removal of a sidewall spacer from over the n-channel active region.

In an alternative embodiment, processing proceeds as previously described through the structure described in FIG. 4. Portions of layer 42 are removed using a conventional or proprietary technique to form sidewall spacers 111 and 113 adjacent to gate electrodes 22 and 24 respectively, as illustrated in FIG. 11. The electronic device 10 can then be masked and sidewall spacer 111 can be removed using a conventional or proprietary technique. In one embodiment, the n-channel source drain mask can be used to provide the masking pattern. In another embodiment, a custom mask can provide the pattern. The mask (not illustrated) can then be removed, leaving the partially completed electronic device 10 as illustrated in FIG. 12.

Figure 13:
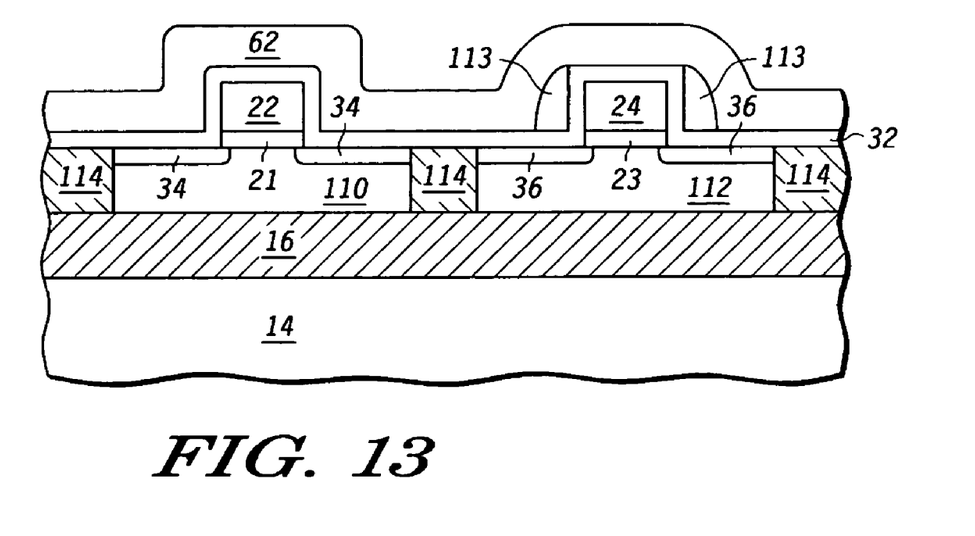
FIG. 13 includes an illustration of a cross-sectional view of the workpiece of FIG. 12 after formation of another sidewall spacer layer.
Figure 14:
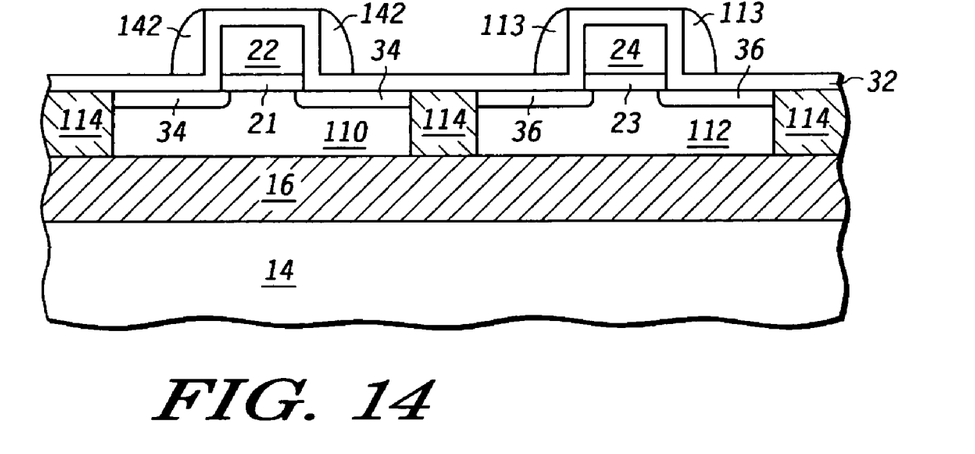
FIG. 14 includes an illustration of a cross-sectional view of the workpiece of FIG. 13 after formation of another sidewall spacer.

Layer 62 is formed overlying electronic device 10 as illustrated in FIG. 13. A portion of layer 62 is removed using a conventional or proprietary technique to form sidewall spacer 142 adjacent to gate electrode 22, as illustrated in FIG. 14. An additional sidewall spacer (not illustrated) may or may not be formed adjacent to sidewall spacer 113 and gate electrode 24 at this time.

In one particular embodiment (not illustrated), a mask can be formed over the active region 110 before performing the spacer etch. After forming the mask, at least a portion of layer 62 is removed using an HF solution, as previously described. The mask is removed, and sidewall spacer 142 is formed from the remaining portion of layer 62 using any one or more of the embodiments as previously described for sidewall spacer formation.

In one embodiment, in a cross-sectional view, each of sidewall spacers 113 and 142 can have a shape and be located as previously described with respect to sidewall spacers 84 and 86. In one embodiment, sidewall spacers 113 and 142 can have different shapes or widths from each other. Processing can continue as previously described for FIGS. 9 and 10 to form a substantially complete electronic device.

A benefit of an exemplary, non-limiting embodiment includes improved carrier mobility within a p-channel transistor structure having its channel lengths and channel widths along <110> crystal directions. The improved carrier mobility can be achieved without using different widths of sidewall spacers. Less processing operations and higher component density and yield may be achieved. Still in one embodiment, different widths of sidewall spacers can be used and still not depart from the scope of the invention.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a p-channel transistor structure including a first gate electrode surrounded by a first sidewall spacer having a first stress, wherein the first sidewall spacer is an only sidewall spacer surrounding the first gate electrode or a closer sidewall spacer as compared to any other sidewall spacer that surrounds the first gate electrode. The electronic device can also include an n-channel transistor structure including a second gate electrode surrounded by a second sidewall spacer having second stress, wherein the second sidewall spacer is an only sidewall spacer surrounding the second gate electrode or a closer sidewall spacer as compared to any other sidewall spacer that surrounds the second gate electrode, wherein the first stress has a lower value of stress as compared to the second stress.

In one embodiment of the first aspect, the electronic device can further include a liner layer, wherein a first substantially L-shaped portion of the liner layer lies between the first sidewall spacer and the first gate electrode and between the first sidewall spacer and a first active region of the p-channel transistor structure. The liner layer can also include a second substantially L-shaped portion of the liner layer lies between the second sidewall spacer and the second gate electrode and between the second sidewall spacer and a second active region of the n-channel transistor structure.

In another embodiment of the first aspect, from a cross-sectional view, each of the first and second sidewall spacers has a shape that is substantially a half parabola, substantially rectangular, or substantially triangular. In still another embodiment, from a cross-sectional view, each of the first and second sidewall spacers has a shape that is substantially L-shaped. In yet another embodiment of the first aspect, the p-channel transistor structure further includes a first active region having a first primary surface, and the n-channel transistor structure further includes a second active region having a second primary surface. Each of the first and second primary surfaces lies substantially along a (100) crystal plane.

In another embodiment of the first aspect, the first sidewall spacer is the only sidewall spacer surrounding the first gate electrode, and the second sidewall spacer is the only sidewall spacer surrounding the second gate electrode.

In a second aspect, a process for forming an electronic device can include providing a substrate. The process can also include forming a first gate electrode of a first transistor structure over the substrate, wherein the first transistor structure includes a first channel region, and forming a second gate electrode of a second transistor structure over the substrate, wherein the second transistor structure includes a second channel region that has a conductivity type opposite that of the first channel region. The process can further include forming a first layer over the first and second gate electrodes and the substrate, wherein the first layer has a first stress, and removing a first portion of the first layer that overlies the second transistor structure. The process can also include forming a second layer over the first and second gate electrodes and the substrate, wherein the second layer has a second stress different from the first stress, and removing a second portion of the second layer that overlies the first transistor structure. The process can still further include forming a first sidewall spacer that surrounds the first gate electrode after removing the first portion of the first layer and removing the second portion of the second layer, wherein the first sidewall spacer is formed before forming any other sidewall spacer that surrounds the first gate electrode. The process can also include forming a second sidewall spacer that surrounds the second gate electrode after removing the first portion of the first layer and removing the second portion of the second layer, wherein the second sidewall spacer is formed before forming any other sidewall spacer that surrounds the second gate electrode.

In one embodiment of the second aspect, the first transistor structure is a p-channel transistor structure, and the second transistor substrate is an n-channel transistor structure. The first stress has a lower value as compared to the second stress. In a particular embodiment, forming the first layer is performed before forming the second layer. In another particular embodiment, forming the first layer is performed after forming the second layer. In another embodiment, forming the first sidewall spacer and forming the second sidewall spacer are performed during a same etch operation.

In still another embodiment of the second aspect, the process can further include forming a liner layer after forming the first gate electrode, after forming the second gate electrode, before forming the first layer, and before forming the second layer. In yet another embodiment, forming the first gate electrode further includes forming the first gate electrode, wherein the first active region has a first primary surface, and forming the second gate electrode further includes forming the second gate electrode, wherein the second active region has a second primary surface. Each of the first and second primary surfaces lies substantially along a (100) crystal plane.

In a third aspect, a process for forming an electronic device can include providing a substrate. The process can also include forming a first gate electrode of a first transistor structure over the substrate, wherein the first transistor structure includes a first channel region, and forming a second gate electrode of a second transistor structure over the substrate, wherein the second transistor structure includes a second channel region that has a conductivity type opposite that of the first channel region. The process can also include forming a first sidewall spacer that surrounds the first gate electrode and a second sidewall spacer that surrounds the second gate electrode, wherein the first and second sidewall spacers have a first stress and removing the second sidewall spacer. The process can also include forming a third sidewall spacer that surrounds the second gate electrode, wherein the third sidewall spacer is formed after removing the second sidewall spacer and has a second stress different from the first stress. After forming the third sidewall spacer, the first sidewall spacer is an only sidewall spacer surrounding the first gate electrode or a closer sidewall spacer as compared to any other sidewall spacer that surrounds the first gate electrode. The third sidewall spacer is an only sidewall spacer surrounding the second gate electrode or a closer sidewall spacer as compared to any other sidewall spacer that surrounds the second gate electrode.

In one embodiment of the third aspect, the first transistor structure is a p-channel transistor structure, the second transistor substrate is an n-channel transistor structure, and the first stress has a lower value as compared to the second stress. In another embodiment, forming the third sidewall spacer includes forming a tensile silicon nitride layer over the first gate electrode, the second gate electrode, the first sidewall spacer, and the substrate, and forming a mask including an opening. An exposed portion of the tensile silicon nitride layer that overlies the first gate electrode and the first sidewall spacer is exposed along a bottom of the opening, and the mask covers the second gate electrode. The process can also include removing the exposed portion of the tensile silicon nitride layer using an HF solution.

In a particular embodiment of the third aspect, forming the first and second sidewall spacers includes forming the first and second sidewall spacers that include a compressive silicon nitride layer. In a more particular embodiment, removing the exposed portion of the tensile silicon nitride layer includes removing the exposed portion of the tensile silicon nitride layer, such that the HF solution has a selectivity, wherein tensile silicon nitride can be etched at least approximately 6 times faster than compressive silicon nitride.

In another embodiment, the process can further include forming a liner layer after forming the first gate electrode, after forming the second gate electrode, and before forming the first and second sidewall spacers. In still another embodiment of the third aspect, forming the first gate electrode further includes forming the first gate electrode, wherein the first active region has a first primary surface, and forming the second gate electrode further includes forming the second gate electrode, wherein the second active region has a second primary surface. Each of the first and second primary surfaces lies substantially along a (100) crystal plane.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device comprising:
   providing a substrate;
   forming a first gate electrode of a first transistor structure over the substrate, wherein the first transistor structure includes a first channel region;
   forming a second gate electrode of a second transistor structure over the substrate, wherein the second transistor structure includes a second channel region that has a conductivity type opposite that of the first channel region;
   forming a first sidewall spacer that surrounds the first gate electrode and a second sidewall spacer that surrounds the second gate electrode, wherein the first and second sidewall spacers have a first stress;
   removing the second sidewall spacer; and
   forming a third sidewall spacer that surrounds the second gate electrode, wherein:
      forming the third sidewall spacer comprises:
         forming a tensile silicon nitride layer over the first gate electrode, the second gate electrode, the first sidewall spacer, and the substrate; and
         removing a portion of the tensile silicon nitride layer using an HF solution;
      the third sidewall spacer is formed after removing the second sidewall spacer and has a second stress different from the first stress; and
      after forming the third sidewall spacer:
         the first sidewall spacer is an only sidewall spacer surrounding the first gate electrode or a closer sidewall spacer as compared to any other sidewall spacer that surrounds the first gate electrode; and
         the third sidewall spacer is an only sidewall spacer surrounding the second gate electrode or a closer sidewall spacer as compared to any other sidewall spacer that surrounds the second gate electrode.

2. The process of claim 1, wherein:
   the first transistor structure is a p-channel transistor structure;
   the second transistor substrate is an n-channel transistor structure; and
   the first stress has a lower value as compared to the second stress.

3. The process of claim 2, wherein forming the third sidewall spacer comprises forming a mask including an opening, wherein:
   the portion of the tensile silicon nitride layer overlies the first gate electrode and the first sidewall spacer is exposed along a bottom of the opening;
   the mask covers the second gate electrode; and
   removing the exposed portion of the tensile silicon nitride layer is performed after forming the mask.

4. The process of claim 3, wherein forming the first and second sidewall spacers comprises forming the first and second sidewall spacers that include a compressive silicon nitride layer.

5. The process of claim 4, wherein removing the exposed portion of the tensile silicon nitride layer comprises removing the exposed portion of the tensile silicon nitride layer, such that the HF solution has a selectivity, wherein tensile silicon nitride can be etched at least approximately 6 times faster than compressive silicon nitride.

6. The process of claim 1, further comprising forming a liner layer after forming the first gate electrode, after forming the second gate electrode, and before forming the first and second sidewall spacers.

7. The process of claim 1, wherein:
   forming the first gate electrode further comprises forming the first gate electrode, wherein the first active region has a first primary surface;
   forming the second gate electrode further comprises forming the second gate electrode, wherein the second active region has a second primary surface; and
   channel lengths of each of the first and second transistor structures lies substantially along at least one <110> crystal direction.

* * * * *

UNITED STATES PATENT AND TRADEMARK OFFICE
CERTIFICATE OF CORRECTION

| | |
|---|---|
| PATENT NO. | : 7,504,289 B2 |
| APPLICATION NO. | : 11/258781 |
| DATED | : March 17, 2009 |
| INVENTOR(S) | : Sangwoo Lim et al. |

It is certified that error appears in the above-identified patent and that said Letters Patent is hereby corrected as shown below:

Title Page; item (75);
Page 1, Inventors: change "Stanley L. Filipiak" to --Stanley M. Filipiak--

Signed and Sealed this

Twenty-eighth Day of July, 2009

JOHN DOLL
*Acting Director of the United States Patent and Trademark Office*